United States Patent [19]

Knauer

[11] Patent Number: 4,833,319
[45] Date of Patent: May 23, 1989

[54] CARRIER GAS CLUSTER SOURCE FOR THERMALLY CONDITIONED CLUSTERS

[75] Inventor: Wolfgang Knauer, Malibu, Calif.

[73] Assignee: Hughes Aircraft Company, Los Angeles, Calif.

[21] Appl. No.: 19,911

[22] Filed: Feb. 27, 1987

[51] Int. Cl.$^4$ .............................................. H05H 3/00
[52] U.S. Cl. ............................... 250/251; 250/423 R; 250/424; 250/425
[58] Field of Search .................. 250/251, 423 R, 424, 250/425, 288, 492.1, 492.2; 118/627; 427/38

[56] References Cited

U.S. PATENT DOCUMENTS

| | | | |
|---|---|---|---|
| 2,621,296 | 12/1952 | Thompson | 250/425 |
| 2,967,239 | 1/1961 | Zemzny | 250/425 |
| 3,229,157 | 1/1966 | Stevens et al. | 250/423 |
| 3,355,615 | 11/1967 | Bihzu et al. | 250/423 |
| 3,700,892 | 10/1972 | Bell, Jr. et al. | 250/425 |
| 4,217,855 | 8/1980 | Takagi | 118/719 |
| 4,281,029 | 7/1981 | Takagi | 427/38 |
| 4,298,795 | 11/1981 | Takeuchi et al. | 250/282 |
| 4,559,096 | 12/1985 | Friedman et al. | 156/272.2 |
| 4,595,835 | 6/1986 | Boulin et al. | 250/423 R |

FOREIGN PATENT DOCUMENTS 0141417 5/1985 European Pat. Off. .
1010319 11/1965 United Kingdom .

OTHER PUBLICATIONS

Martin, Angewandte Chemie, Int. Ed. Engl., vol. 25, No. 3, Mar. 1986, pp. 197–211.
Spangler et al., Jrnl. Phys. E: Sci. Instrum., vol. 19, No. 3, Mar. 1986, pp. 191–198.
Theeten et al., Journal of Crystal Growth, vol. 37, No. 3, Mar. 1977, pp. 317–327.
Toshino Takagi, Kakuei Matsubara and Hiroshi Takaoka, "Optical and Thermal Properties of BeO thin Films prepared by Reactive Ionized-Cluster Beam Technique", J. Applied Physics, 51(10), 1980, pp. 5419–5424.
B. G. DeBoer and G. D. Stein, "Production and Electron Diffraction Studies of Silver Metal Clusters in the Gas Phase", Surface Science 106 (1981), pp. 84–94.
I. Yamada, G. D. Stein, H. Usui and T. Takagi, "Structure of Vaporized-Metal Clusters", in Proceedings of the Sixth Symposium on Ion Sources and Ion-Assisted Technology, 1982, pp. 47–52.
Jurgen Gspann: "On the Internal State of Free Clusters and Its Relation to Deposition", Proc. ICBT Tokyo-Kyoto (1986), pp. 109–116.

Primary Examiner—Jack I. Berman
Attorney, Agent, or Firm—Wanda K. Denson-Low; V. G. Laslo; A. W. Karambelas

[57] ABSTRACT

A source of clusters of atoms is provided, wherein the clusters are thermally conditioned after their formation so that the clusters are in the liquid state. A beam of clusters is first formed during the mixing of a stream of atoms and a carrier gas. The beam of clusters mixed with carrier gas is passed through a conditioner, preferably including a heated drift tube, to bring the clusters to a temperature whereat the clusters are in a condensed state without crystalline order, comparable to the liquid state. The conditioned cluster beam passes to vacuum, with separation and removal of a large portion of the carrier gas mixed therewith, so that cooling of the clusters in the cluster beam is minimized during their flight to the cluster target.

16 Claims, 1 Drawing Sheet

CARRIER GAS CLUSTER SOURCE FOR THERMALLY CONDITIONED CLUSTERS

The U.S. Government has rights in this application pursuant to Contract No. N00014-85-C-0523, which was awarded by the Department of the Navy.

BACKGROUND OF THE INVENTION

This invention relates to the deposition of thin films, and, more particularly, to sources for cluster beams.

The deposition of thin films upon substrates is an important manufacturing and research tool in a variety of fields. For example, microelectronic devices are prepared by depositing successive film layers onto a substrate to obtain specific electronic properties of the composite. Photosensitive devices such as vidicons and solar cells are manufactured by depositing films of photosensitive materials onto substrates. Optical properties of lenses are improved by depositing films onto their surfaces. These examples are, of course, only illustrative of the thousands of applications of thin film deposition techniques.

In the highly controlled approach to thin-film deposition that is characteristic of applications where a high quality film is required, the film is built up by successive deposition of monolayers of the film, each layer being one atom thick. The mechanics of the deposition process can best be considered in atomistic terms. Generally, in such a process the surface of the substrate must be carefully cleaned, since minor contaminant masses or even contaminant atoms can significantly impede the deposition of the required highly perfect film. The material of the film is then deposited by one of many techniques developed for various applications, such as vapor deposition, electron beam evaporation, sputtering, or chemical vapor deposition, to name a few.

In another technique for depositing thin films, ionized clusters of atoms are formed in a cluster deposition apparatus. These clusters usually have on the order of about 1000-2000 atoms each. The clusters are ionized and then accelerated toward the substrate target by an electrical potential that imparts an energy to the cluster equal to the accelerating voltage times the ionization level of the cluster. Upon reaching the surface of the substrate, the clusters disintegrate at impact into atoms free to move on the surface. Each atom fragment remaining after disintegration has an energy equal to the total energy of the cluster divided by the number of atoms in the cluster. The cluster prior to disintegration therefore has a relatively high mass and energy, while each atom remaining after disintegration has a relatively low mass and energy. The energy of the atom deposited upon the surface gives it mobility on the surface, so that it can move to kinks or holes that might be present on the surface. The deposited atom comes to rest in the imperfections, thereby removing the imperfection and increasing the perfection and density of the film. Other approaches to using clusters have been developed, and thin film deposition using cluster beams is a promising commercial film manufacturing technique.

The cluster source, which produces the clusters, is a key component of a cluster beam deposition apparatus. The cluster source should produce a high mass flow of clusters of a selected size range, and exhibit a high cluster-forming efficiency. That is, the cluster beam should have a large fraction of the mass of the beam present as clusters rather than atoms, or the beneficial effect of using clusters may be lost. The cluster source should also provide a cluster beam with the clusters in the proper energetic state.

One type of cluster source is the carrier-gas cluster source, wherein a stream of the atoms to be condensed into clusters is emitted from a crucible into a gas mixing chamber. In the gas mixing chamber, a carrier gas is mixed with the stream of atoms, quenching the atoms to supersaturation and forming clusters. The clusters emerging from the source pass into a vacuum and are ionized and accelerated toward the target.

Carrier-gas cluster sources have two significant advantages over surface-growth cluster sources, the other most significant type of source. The carrier-gas cluster sources have a much higher efficiency of cluster formation, resulting in a higher fraction of the mass of the cluster beam being clusters rather than atoms. Second, the carrier-gas cluster sources can be used to form cluster beams of materials with extremely high melting points, such as refractory metals, which is not possible with surface-growth cluster sources.

However, it has been observed experimentally that the films deposited using conventional carrier-gas cluster sources tend to be grainy and rough. As a result, the films are not useful for many types of demanding applications such as microelectronic devices. It would be desirable to improve the quality of the deposited films obtained from carrier-gas cluster sources, while retaining the advantages in efficiency and versatility presently enjoyed by such sources. The present invention fulfills this need, and further provides related advantages.

SUMMARY OF THE INVENTION

The present invention provides a modified carrier-gas cluster source which produces clusters conditioned to deposit films of high quality on a substrate. The source retains a high efficiency of cluster formation, as the formation process is not substantially altered. The source also is capable of producing clusters of high temperature materials. The modified construction is fully compatible with existing cluster deposition systems, and can be economically constructed.

In accordance with the invention, a carrier gas cluster source for providing clusters to a target comprises beam source means for generating a cluster beam, the beam source means including an evaporation source which emits a beam of atoms and a gas mixing volume wherein a carrier gas mixes with the beam of atoms to form a cluster beam having clusters of atoms mixed with a flow of the carrier gas; conditioning means for conditioning the cluster beam so that substantially all of the clusters are in the liquid state; and transmission means for transmitting the clusters of the conditioned cluster beam to the target with substantially all of the clusters in the liquid state prior to impacting the target.

In a preferred embodiment, a carrier gas cluster source comprises a beam source including a gas mixing chamber and a crucible which emits a stream of atoms of a cluster material into the mixing chamber, wherein the stream of atoms and a carrier gas intermix so that a beam of clusters of the cluster material mixed with the carrier gas is formed; a drift tube through which the beam of clusters and the carrier gas passes after leaving the beam source; a heater for heating the drift tube; and a nozzle through which the beam of clusters and the carrier gas passes after leaving the drift tube.

Studies of the cluster beam produced by prior carrier-gas cluster sources, and of the films produced when such cluster beams impact a target, indicate that at least a portion of the clusters in the beam are in the solid state. In the solid state, as that term is used herein, the matter is condensed into clusters, and additionally exhibits the crystallinity characteristic of bulk solid materials. Apparently, when such solid clusters impact the target, the cluster does not disintegrate to scatter atoms about the surface in the desired manner. As a result, the solid cluster leaves a grainy surface structure to the film. As more clusters are deposited, the graininess is retained, resulting in a film of poor quality.

The formation of clusters in a carrier-gas cluster source occurs when a flowing gas stream quenches the vapor emitted from the vapor source, so that the vapor becomes supersaturated in the gas stream and forms clusters. Quenching must occur rapidly and at a low gas temperature, or the clusters will grow only to an undesirably small size. Another result of the quench by a gas at comparatively low temperature is that the clusters exhibit the crystallinity characteristic of solids.

In the present invention, the clusters are conditioned to the liquid state after formation. As used herein, the "liquid state" is a term of art which refers to a condensed state of matter wherein there is substantially no crystallinity, by analogy to bulk liquid matter.

One approach to conditioning the clusters is to increase their temperature, where temperature is reflected in the random kinetic energy of the atoms in the cluster, not the directed kinetic energy of the clusters as they move toward their target. This increased energy overcomes the tendency of the clusters to become crystalline at low temperatures. In the preferred embodiment, the clusters are passed through a diffusion tube maintained at a temperature sufficiently high to heat the clusters to a temperature whereat crystallinity vanishes and the clusters are in the liquid state. The heating is accomplished by an efficient conduction process aided by the presence of the carrier gas intermixed with the clusters within the diffusion tube.

Virtually all of the clusters are conditioned to this liquid state, but a few of the largest clusters may not be heated sufficiently to remove the crystallinity. Such large clusters, if they were to reach the target, would cause undesirable graininess. However, in practice the largest clusters are removed from the cluster beam by a mass separator, and do not pose a problem to film quality.

After the clusters have been conditioned to the proper non-crystalline state, they must be preserved in this state until impacting the target. Transmission means for achieving such preservation separates and removes the majority of the carrier gas from the beam. With the carrier gas removed, the clusters travel in a near vacuum. In such a vacuum, conductive and convective heat losses from the clusters are nearly eliminated. Radiative heat loss from the tiny clusters in a vacuum is also small. The result is that the temperature state of the clusters attained in the conditioning means is retained as the clusters pass in vacuum through subsequent ionization, mass separator, accelerator, and focusing components, if any. The clusters reaching the target retain the temperature and non-crystalline, loosely bound state established in the conditioning means.

Alternatively stated, the present invention is embodied in a process for providing a cluster beam of high quality to impact upon a target, comprising the steps of forming a cluster beam by mixing a carrier gas with a stream of atoms; conditioning the clusters in the cluster beam so that substantially all of the clusters are in the liquid state; and transmitting the conditioned cluster beam to the target, with substantially all of the clusters in the liquid state prior to impacting upon the target.

It will now be appreciated that the cluster source of the present invention provides an important advance in the art of carrier-gas cluster sources. The high cluster formation efficiency and versatility of prior carrier-gas cluster sources is retained, but in addition the clusters are conditioned to a non-crystalline, liquid state so that the deposited film is smooth and free of graininess and other imperfections characteristic of deposition of crystalline clusters. This invention therefore permits carrier-gas cluster sources to be used competitively with other cluster sources. Other features and advantages of the present invention will be apparent from the following more detailed description, taken in conjunction with the accompanying drawings, which illustrate, by way of example, the principles of the invention.

DETAILED DESCRIPTION OF THE PREFERRED EMBODIMENT

Figure 1:
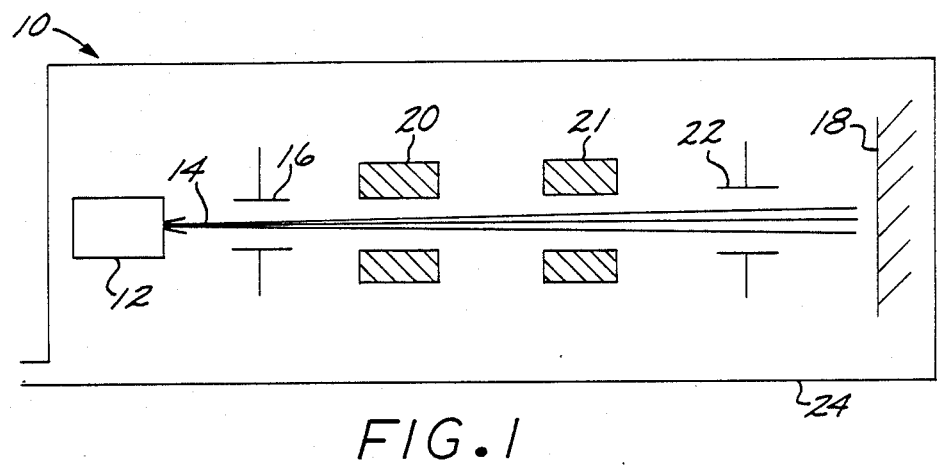
FIG. 1 is a schematic view of a carrier gas cluster beam deposition apparatus.

A typical cluster beam deposition apparatus 10 is depicted in FIG. 1, to illustrate the type of system in which the present invention finds application. The deposition apparatus 10 includes a cluster source 12 which produces a cluster beam 14. The cluster beam 14 is composed of clusters of various sizes, as well as some unclustered atoms. The clusters and atoms of the beam 14 are ionized in an ionizer 16, which is usually adjusted to give each cluster and atom a single charge. That is, a cluster having 2000 atoms would have only a single charge, as would a single atom.

It is desired that only clusters of a narrow range of sizes reach a target 18. The beam 14 is therefore passed through a mass separator 20 which separates clusters significantly larger or smaller than the selected size, permitting only clusters of about the desired size to reach the target 18. Finally, the cluster beam 14 is energized by accelerator electrodes 21, and then focused and deflected by lenses and deflection plates 22, so that patterns of the clusters may be written across the surface of the target 18. The entire deposition apparatus is placed into a vacuum chamber 24, which maintains the target and the cluster beam in a vacuum.

Figure 2:
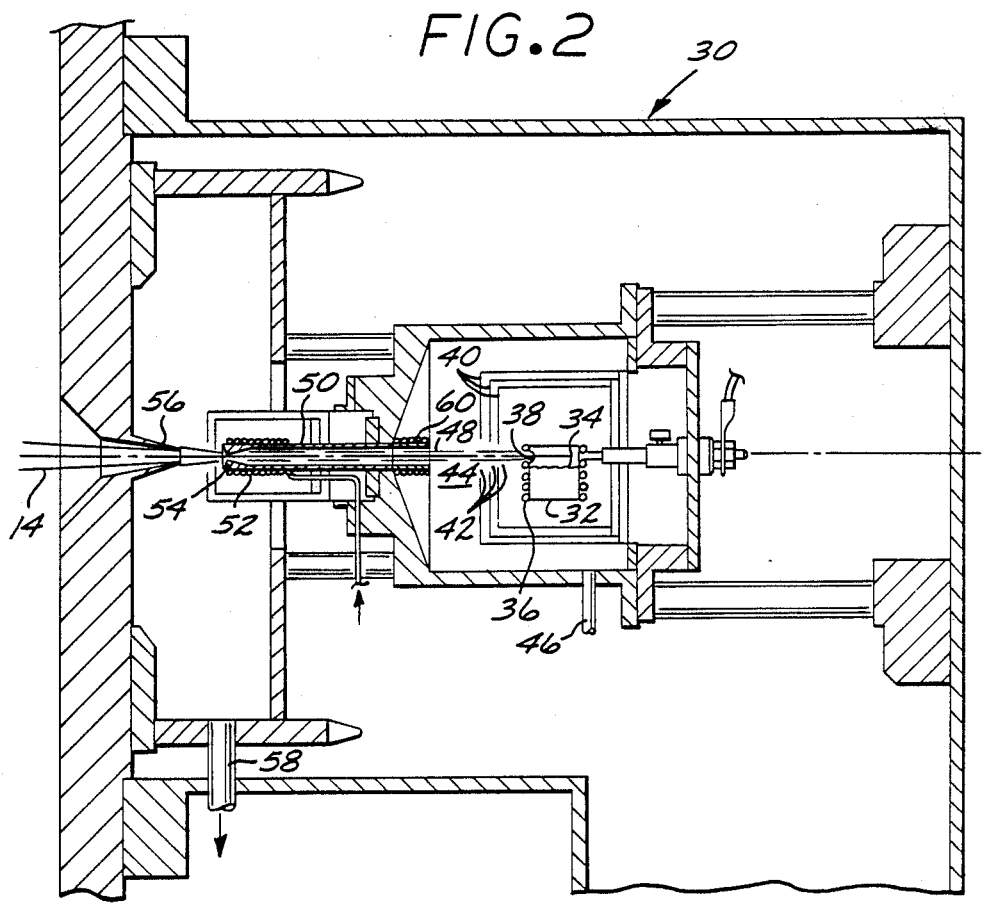
FIG. 2 is a side sectional view of a carrier-gas cluster source in accordance with the present invention.

The present invention is embodied in the cluster source, and is illustrated in FIG. 2 as the improved cluster source 30. The cluster source 30 includes a crucible 32 into which is placed a supply 34 of the material to be transported to the target 18 as clusters. Such material may be a metal or nonmetal. The crucible 32 and the supply 34 of material therein are heated by any appropriate means, here illustrated as a resistance winding 36 around the crucible 32. The crucible is a closed vessel, except for an aperture 38 through which escapes a vapor of the material of the supply 34. The crucible 32 is surrounded by heat shields 40 to maintain the temperature of the crucible 32 and to prevent heating of other portions of the source 30.

The vapor of evaporated material from the crucible 32 passes through the aperture 38, an opening 42 in the heat shields 40, and into a gas mixing chamber 44, whose walls are maintained at about ambient temperature. A stream of a carrier gas is separately introduced into the gas mixing chamber 44 from a gas inlet 46. The evaporated vapor is at a temperature determined by the vaporization from the crucible 32. The carrier gas temperature is well below that of the evaporated vapor, typically ambient temperature, so that vapor atoms are rapidly cooled to supersaturation when vapor and carrier gas mix, promoting cluster formation in a relatively small volume in the gas mixing chamber 44. Othewise, clusters grow to much smaller sizes. This result is undesirable, as clusters of about 2000 atoms per cluster are preferred in most cases.

The rapid cooling of the vapor to form clusters causes the clusters to have a low temperature. That is, the clusters form condensed masses with crystalline or partly crystalline structures which, without the use of the present invention, do not readily disintegrate when impacted upon the target 18.

In the mixing chamber 44, clusters of various sizes are formed from a fraction of the evaporated mass, while some of the evaporant remains as unclustered atoms. The evaporant atoms, clusters, and carrier gas intermix to form a mixed beam 48 that flows away from the gas inlet and toward the vacuum of the vacuum chamber 24.

The mixed beam 48 enters a drift tube 50, which is a hollow cylindrical tube that is heated on the outside by a resistance heater 52. As the mixed beam passes through the drift tube 50, the clusters are conditioned so that substantially all of the clusters transform to the liquid state, with little or no crystallinity. The heating of the clusters is accomplished primarily by conduction and convection from the heated walls of the drift tube 50, through the medium of the intermixed carrier gas.

The temperature required to achieve the liquid or disordered state in the clusters is not the same as the bulk melting temperature of the material making up the cluster. Because of their small size, clusters become liquid upon heating at temperatures which are typically well below the bulk melting temperature. For example, metal clusters of about 1000 atoms are expected to be liquid at about two-thirds of the bulk melting temperature, and metal clusters of 100 atoms are expected to be liquid at about one-half of the bulk melting temperature. The required temperature that must be attained by the clusters as they pass through the drift tube 50 therefore depends upon the material of the clusters and upon the size of the clusters impacted upon the target. The maximum temperature of the drift tube 50 is preferably maintained at about that required to liquify the clusters, as higher temperatures may cause re-evaporation of atoms from the clusters.

The necessary drift tube operating temperature for particular conditions is best determined by a set of tests wherein the crystallinity of the clusters is measured in flight by diffraction means, or by observing the quality of the deposited film, as the operating temperature of the drift tube is gradually increased.

The length of the drift tube 50 must be sufficiently great to heat the clusters, but not so great that the clusters deposit droplets on the inside walls of the drift tube. The minimum required length depends upon the diameter of the drift tube 50, the initial temperature of the clusters and the required final temperature, the nature of the clusters, the size of the clusters, the properties of the carrier gas, and the flow rate of the carrier gas. Approximate calculations have been performed for silver clusters of 2000 atoms, initially at ambient temperature and finally at 1000° K., in argon gas having a flow rate of 100 centimeters per second. The clusters adjacent the wall of the drift tube reach the wall temperature within about 0.1 centimeter, and the thermal diffusion of the heat to the remainder of the clusters requires a distance approximately equal to the diameter of the drift tube. Thus, the minimum length of the drift tube 50 is determined to be about the diameter of the drift tube, for the clusters throughout the tube to reach the equilibrium wall temperature.

The maximum length of the tube is limited by condensation of droplets of the cluster material on the heated wall. This maximum length is thought to be about five times the diameter of the tube, based upon observations of the condensation of clusters in similar systems.

Thus, it is believed that the length of the drift tube 50 should be from about one to about five times the diameter of the drift tube for optimum steady state operation. These design parameters reflect the presently preferred approach and embodiment, and are not thought to be critical limitations.

After the clusters have passed through the drift tube 50 and become conditioned to the proper temperature, they must be introduced into the vacuum of the vacuum chamber 24 in such a way that the pumping capacity of the chamber is not overloaded, and so that the carrier gas is separated and removed from the cluster beam 14 to the extent reasonably possible. The cluster gas must be separated to prevent substantial cooling of the clusters that have been conditioned in the drift tube 50. The presence of the carrier gas promotes heat transfer to the clusters in the heated drift tube 50 by conduction and convection, and, if present, would promote heat transfer away from the clusters by the same mechanisms during their flight from the cluster source 30 to the target 18. With the carrier gas removed from the cluster beam, heat loss from the clusters by conduction and convection is virtually eliminated. Since loss of heat by radiation from the small clusters is small, total heat loss from the clusters is negligible during their travel to the target.

The carrier gas is separated and removed from the cluster beam by expanding the cluster beam through a nozzle 54 placed downstream of the drift tube 50. In the expansion, the trajectory of the heavy clusters is not changed significantly, and the clusters continue unaltered. The trajectories of the light atoms or molecules of the carrier gas, on the other hand, are deflected radially outwardly in free expansion. The previously uniformly intermixed clusters and carrier gas are thereby separated into a radial distribution with the clusters predominantly at the center of the distribution.

With the altered beam distribution, the atoms or molecules of the carrier gas can be removed from the beam by any of several techniques. The preferred approach is to provide a skimmer 56 which deflects the radially outward portions of the beam, i.e., the carrier gas, and directs the deflected carrier gas to a pumping port 58. The approach of the skimmer 56 is not thought to remove all of the carrier gas from the clusters, but is successful in removing a sufficiently large amount of the carrier gas to reduce subsequent heat loss from the clusters to acceptably low levels.

The cluster beam 14 emerging from the cluster source 30 is then processed through the remainder of the deposition apparatus in the manner previously described. The liquid state of the clusters does not alter or impede the functioning of the ionizer 16, mass separator 20, accelerator 21, or deflection plates 22.

In operating the cluster source 30, the carrier gas flow rate must be controlled as an operating parameter to maintain a high cluster forming efficiency, so that a high fraction of the mass of the material evaporated from the crucible 32 is transported as clusters. Heat from the drift tube 50 tends to diffuse upstream (opposite to the mass flow) toward the gas mixing chamber 44. This heat diffusion raises the temperature of the mixing between the evaporated atoms and the carrier gas, reducing the efficiency of cluster formation. On the other hand, the mass flow of the carrier gas causes heat to be transported in the downstream direction. Thus, a minimum steady state operating gas flow velocity can be calculated approximately by equating the upstream and downstream heat diffusion rates. For the operating parameters discussed previously, the required gas flow velocity is calculated to be about 140 centimeters per second, which is well within the capabilities of the system. If the carrier gas flows at a lower rate, there is expected a net heat flow in the upstream direction toward the gas mixing chamber 44, which would defeat steady state operation by raising the mixing temperature and reducing cluster forming efficiency.

The upstream heat flow problem can be reduced or avoided by operating the cluster source in a pulsed manner. It is possible to operate the source continuously at lower carrier gas flow velocities by guarding against upstream heat flow with a cooling means such as an optional cooling tube 60 placed between the mixing chamber 44 and the drift tube 50. The cooling tube 60 operates in the reverse manner to the drift tube 50, by extracting heat, which would otherwise diffuse upstream to the mixing chamber 44, from the gas stream to the cooled walls.

In a specific example, the production of silver clusters of about 40 Angstroms diameter is accomplished by placing silver into the crucible 32, and heating the crucible 32 to about 1500° K. to emit a stream of evaporated atoms. Argon gas at ambient temperature is introduced at a pressure of about 0.5 Torr and a flow rate of about 150 centimeters per second, and mixed with the silver vapor in the gas mixing chamber 44. The drift tube is 0.6 centimeters in diameter and 2 centimeters long, and is maintained at about 830° K. (two thirds of the melting point). The clusters leaving the source 30 are expected to be fully liquid.

The improved cluster source of the present invention thus improves the quality of the deposited films made using carrier-gas cluster sources, by conditioning the clusters are liquid and temperature whereat the clusters are liquid and without substantial crystalline order. The cluster source retains the high cluster forming efficiency and versatility of prior cluster sources, while significantly improving the quality of the films.

Although a particular embodiment of the invention has been described in detail for purposes of illustration, various modifications may be made without departing from the spirit and scope of the invention. Accordingly, the invention is not to be limited except as by the appended claims.

What is claimed is:

1. A carrier gas cluster source for providing clusters to a target, comprising:
   beam source means for generating a cluster beam, said beam source means comprising evaporation source means for emitting a beam of atoms and a gas mixing chamber wherein a carrier gas mixes with the beam of atoms to form a cluster beam having clusters of atoms mixed with a flow of the carrier gas;
   conditioning means for conditioning the cluster beam after the clusters are formed so that substantially all of the clusters are in the liquid state; and
   transmission means for transmitting the clusters of the conditioned cluster beam to the target with substantially all of the clusters in the liquid state prior to impacting the target.

2. The cluster source of claim 1, wherein said conditioning means includes means for adjusting the temperature of the clusters.

3. The cluster source of claim 1, wherein said conditioning means is a drift tube through which the cluster beam passes.

4. The cluster source of claim 3, wherein said conditioning means further includes a heater for said drift tube.

5. The cluster source of claim 1, wherein said evaporation source is a crucible having a heater therefor, and having an aperture therein for emitting a beam of atoms.

6. The cluster source of claim 1, wherein said transmission means includes means for removing at least a portion of the carrier gas from the cluster beam.

7. The cluster source of claim 1, wherein said transmission means includes an expansion nozzle.

8. The cluster source of claim 1, wherein said transmission means includes a skimmer for removing a portion of the carrier gas from the cluster beam.

9. The carrier gas cluster source, comprising:
   a beam source including a gas mixing chamber and a crucible which emits a stream of atoms of a cluster material into said mixing chamber, wherein the stream of atoms and a carrier gas intermix so that a beam of clusters of the cluster material mixed with the carrier gas is formed;
   a drift tube through which the beam of clusters and the carrier gas passes after leaving said beam source;
   a heater for heating said drift tube; and
   a nozzle through which the beam of clusters and the carrier gas passes after leaving said drift tube.

10. The cluster source of claim 9, wherein the length of said drift tube is from about one to about five times the diameter of said drift tube.

11. The cluster source of claim 9, further including a cooling tube through which the beam of clusters and the carrier gas pass prior to entering said drift tube, said cooling tube being positioned between said drift tube and said beam source.

12. A process for providing a cluster beam of high quality to impact upon a target, comprising the steps of:
   forming a cluster beam by mixing a carrier gas with a stream of atoms;
   conditioning the clusters in the cluster beam so that substantially all of the clusters are in the liquid state; and
   transmitting the conditioned cluster beam to the target, with substantially all of the clusters in the liquid state prior to impacting upon the target.

13. The process of claim 12, wherein the carrier gas is an inert gas.

14. The process of claim 12, wherein said step of conditioning is accomplished by heating the clusters to a temperature wherein the clusters are in a condensed state but without crystalline order.

15. The process of claim 12, wherein said step of conditioning the clusters includes the step of passing the clusters through a drift tube to heat the clusters.

16. The process of claim 12, wherein said step of transmitting includes the step of separating and removing at least a portion of the carrier gas from the clusters.

* * * * *